United States Patent
Mitchell et al.

(10) Patent No.: US 8,766,720 B2
(45) Date of Patent: Jul. 1, 2014

(54) HYBRID LOAD DIFFERENTIAL AMPLIFIER OPERABLE IN A HIGH TEMPERATURE ENVIRONMENT OF A TURBINE ENGINE

(75) Inventors: David J. Mitchell, Oviedo, FL (US); John R. Fraley, Fayetteville, AR (US); Jie Yang, Fayetteville, AR (US); Cora Schillig, Orlando, FL (US); Roberto Marcelo Schupbach, Fayetteville, AR (US); Bryon Western, West Fork, AR (US)

(73) Assignee: Siemens Energy, Inc., Orlando, FL (US)

( * ) Notice: Subject to any disclaimer, the term of this patent is extended or adjusted under 35 U.S.C. 154(b) by 75 days.

(21) Appl. No.: 13/537,572

(22) Filed: Jun. 29, 2012

(65) Prior Publication Data

US 2014/0002191 A1   Jan. 2, 2014

(51) Int. Cl.
*H03F 3/45* (2006.01)

(52) U.S. Cl.
CPC ................................. *H03F 3/45* (2013.01)
USPC ................................ 330/253; 340/870.07

(58) Field of Classification Search
CPC ......................................................... H03F 3/45
USPC ................................ 330/253; 340/870.07
See application file for complete search history.

(56) References Cited

U.S. PATENT DOCUMENTS

| | | | |
|---|---|---|---|
| 4,166,243 A * | 8/1979 | West et al. | 324/537 |
| 7,132,883 B2 | 11/2006 | Huijsing et al. | |
| 7,696,817 B1 | 4/2010 | Boucher et al. | |
| 8,023,269 B2 | 9/2011 | Mitchell et al. | |
| 8,033,722 B2 | 10/2011 | Kulkarni et al. | |
| 8,092,080 B2 | 1/2012 | Mitchell et al. | |
| 2005/0198967 A1 * | 9/2005 | Subramanian | 60/803 |
| 2006/0197597 A1 * | 9/2006 | Ananth | 330/253 |
| 2009/0121896 A1 | 5/2009 | Mitchell et al. | |
| 2010/0019404 A1 | 2/2010 | Mitchell | |
| 2010/0039289 A1 | 2/2010 | Mitchell et al. | |
| 2010/0039290 A1 | 2/2010 | Mitchell et al. | |
| 2010/0078202 A1 | 4/2010 | Mitchell et al. | |

OTHER PUBLICATIONS

Patil, "Silicon Carbide JFet Integrated Circuit Technology for High-Temperature Sensors", Department of Electrical Engineering and Computer Science, Case Western Reserve University, May 2009, pp. 1-158 (pp. I-XX are cover page and table of contents), Cleveland, OH.

Neudeck et al, "Extreme temperature 6H-SiC JFET integrated circuit technology", Phys. Status Solidi A 206, No. 10, pp. 2329-2345 (2009) / DOI 10.1002/pssa.200925188, Cleveland, OH.

Tomana et al., "A Hybrid Silicon Carbide Differential Amplifier for 350° C. Operation", IEEE Transactions on Components, Hybrids, and Manufacturing Technology, vol. 16, No. 5, Aug. 1993, pp. 536-542, Auburn, AL.

(Continued)

*Primary Examiner* — Robert Pascal
*Assistant Examiner* — Khiem Nguyen

(57) ABSTRACT

A circuitry (120) adapted to operate in a high-temperature environment of a turbine engine is provided. The circuitry may include a differential amplifier (122) having an input terminal (124) coupled to a sensing element to receive a voltage indicative of a sensed parameter. A hybrid load circuitry (125) may be AC-coupled to the differential amplifier. The hybrid load circuitry may include a resistor-capacitor circuit (134) arranged to provide a path to an AC signal component with respect to the drain terminal of the switch (e.g., 126) of a differential pair of semiconductor switches 126, 128, which receives the voltage indicative of the sensed parameter.

23 Claims, 3 Drawing Sheets

(56) References Cited

OTHER PUBLICATIONS

Yang et al, "An All Silicon Carbide High Temperature (450+° C.) High Voltage Gain AC Coupled Differential Amplifier", Materials Science Forum vols. 679-680 (2011) pp. 746-749, Mar. 28, 2011 at www.scientific.net © (2011) Trans Tech Publications, Switzerland, doi: 10.4028.

Neudeck, "Silicon Carbide Integrated Circuit Fabricated and Electrically Operated for 2000 hr at 500° C.", http://www.grc.nasa.gov/WWW/RT/2007/Inst-Cnt/17-RIS-neudeck.html, pp. 1-4, Nov. 7, 2008, Ohio Aerospace Institute (OAI) Brook Park, OH.

Seitz, "Designing with Thermocouples", Technology edge, © National Semiconductor Corporation 2009, Application Note AN-1952, pp. 1-3, Santa Clara, CA.

\* cited by examiner

HYBRID LOAD DIFFERENTIAL AMPLIFIER OPERABLE IN A HIGH TEMPERATURE ENVIRONMENT OF A TURBINE ENGINE

FIELD OF THE INVENTION

The present invention is generally related to electronic circuits, and more particularly, to circuitry, which may be adapted to operate in a high temperature environment of a turbine engine.

BACKGROUND OF THE INVENTION

Turbine engines, such as gas turbine engines, may be used in a variety of applications, such as driving an electric generator in a power generating plant or propelling a ship or an aircraft. Firing temperatures of modern gas turbine engines continue to increase in response to the demand for higher combustion efficiency.

It may be desirable to use circuitry, such as may be used in a wireless telemetry system, to monitor operational parameters of the engine. For example, to monitor operating temperatures of components of the turbine, such as a turbine blade, or to monitor operational stresses placed upon such components during operation of the engine. Aspects of the present invention offer improvements in connection with such a circuitry.

BRIEF DESCRIPTION OF THE DRAWINGS

The invention is explained in the following description in view of the drawings that show.

DETAILED DESCRIPTION OF THE INVENTION

Example embodiments of the present invention may be directed to electronic circuitry, which, in one example application, may be used in an internal combustion engine, such as a turbine engine, instrumented with a telemetry system. This example application may allow transmitting sensor data from a movable component, such as a rotatable turbine engine blade, having certain electronic circuitry, which, for example, may operate in an environment having a temperature exceeding approximately 300° C.

For purposes of the disclosure herein, the term "high temperature" environment without additional qualification may refer to any operating environment, such as that within portions of a turbine engine, having a maximum operating temperature exceeding approximately 300° C. It will be appreciated that aspects of the present invention are not necessarily limited to a high temperature environment, since circuitry embodying aspects of the present invention may be used equally effective in a non-high temperature environment.

Figure 1:
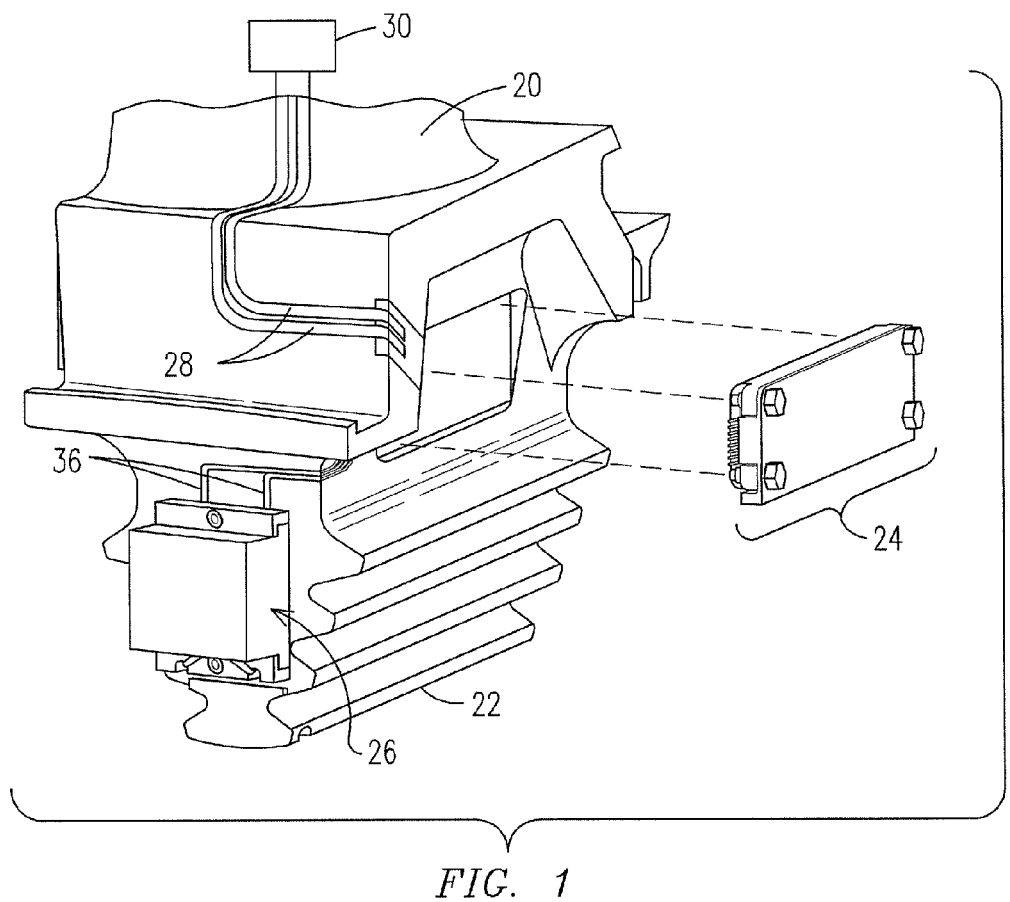
FIG. 1 is a partial isometric view of an exemplary turbine blade including electronic circuitry, which may be used by a wireless telemetry system to monitor operational parameters of the blade.

FIG. 1 illustrates a turbine blade 20 (fragmentarily illustrated), as may be instrumented with an example telemetry system, which may include a wireless telemetry transmitter assembly 24 and an antenna assembly 26. Lead lines or connectors 28 may extend from one or more sensors, such as sensor 30, to telemetry transmitter assembly 24, which may be mounted proximate a blade root 22 and may include various telemetry transmitter circuitry. Lead lines 28 may route electronic data signals from sensor 30 to telemetry transmitter assembly 24, where the signals may be processed by a processor. Further lead lines or electrical connectors 36 may be used for routing electronic data signals from telemetry transmitter circuitry to antenna assembly 26.

Figure 2:
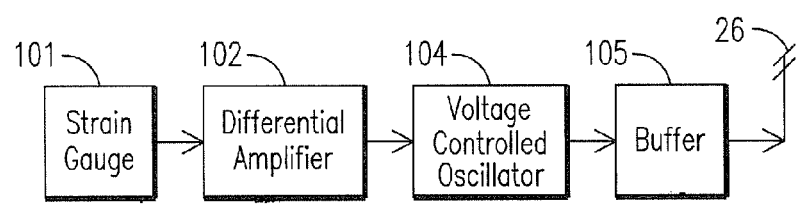
FIG. 2 is a block diagram of an example strain gauge circuitry, which may be used by the telemetry system, and which may benefit from a high-gain differential amplifier embodying aspects of the present invention.

FIG. 2 illustrates a block diagram of an example strain gauge circuitry, which may be used in a turbine component (e.g., turbine blade 20 (FIG. 1)) instrumented with a telemetry system. A signal indicative of the amount of strain, which may develop on a measured turbine component, may be sensed by a strain gauge 101, which signal may be coupled to a differential amplifier 102. The output of the differential amplifier 102 may be coupled to a voltage-controlled oscillator (VCO) 104, which may generate an oscillatory signal having a frequency, which is indicative of the amount of strain which develops on the measured turbine component. This oscillatory signal may be buffered by a buffer 105 and coupled to antenna 26 for transmission to an external receiver (not shown), which may be tuned to the carrier frequency.

Figure 3:
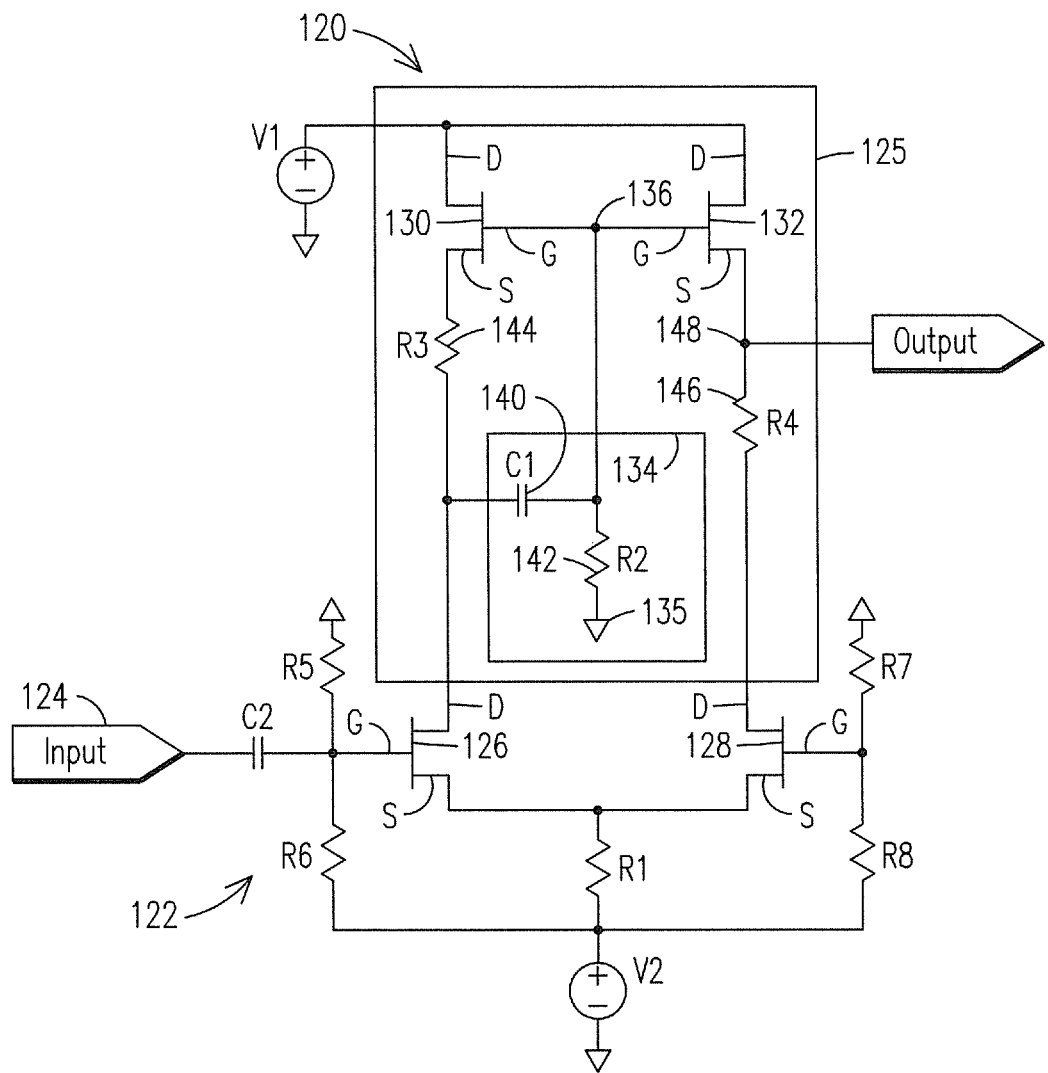
FIG. 3 is a schematic representation of one example embodiment of an AC-coupled hybrid-load differential amplifier embodying aspects of the present invention.
Figure 4:
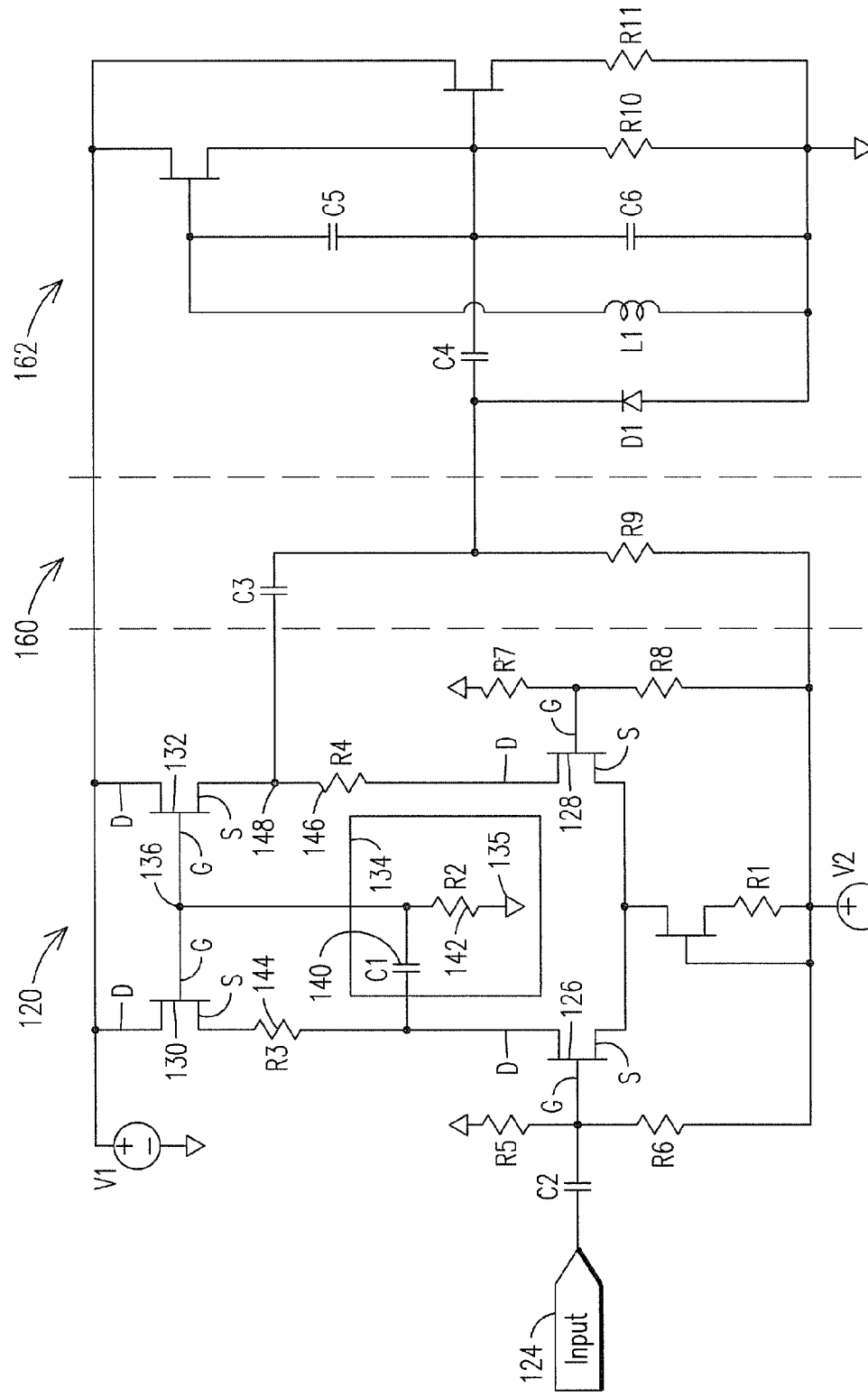
FIG. 4 is a schematic representation of a single-stage differential amplifier embodying aspects of the present invention, as may be integrated in one example strain gauge circuitry.

FIGS. 3-4 and related description below will provide details of circuitry embodying aspects of the present invention, which in one example application, may be used in strain gauge circuitry, as exemplarily illustrated in FIG. 2. It will be appreciated that such example application should not be construed in a limiting sense being that circuitry embodying aspects of the present invention may be used in other applications.

FIG. 3 is a schematic representation of one example embodiment of circuitry 120 (also shown in FIG. 4) embodying aspects of the present invention. Circuitry 120 includes a differential amplifier 122 having an input terminal 124, which may be coupled to a sensing element (e.g., strain gauge 101 FIG. 2) to receive the voltage indicative of a sensed parameter (e.g., voltage indicative of strain). Differential amplifier 122 may include a first pair of semiconductor switches 126, 128 (e.g., differential pair of semiconductor switches). Biasing of the differential pair of semiconductor switches 126, 128 may be controlled by a bridge circuit made up by resistors R5, R6, R7 and R8 using biasing techniques well-understood by one skilled in the art. Circuitry 120 further includes a hybrid load circuitry 125, which in accordance with example aspects of the present invention may be AC-coupled (alternating current-coupled) to differential amplifier 122, as elaborated in greater detail below.

Hybrid load circuitry 125 may include a second pair of semiconductor switches 130,132 (e.g., active-load pair of semiconductor switches). Each of such pairs of semiconductor switches has a respective drain terminal (D), a respective source terminal (S) and a respective gating terminal (G). In one example embodiment, the first pair of semiconductor switches 126, 128 and the second pair of semiconductor switches 130, 132 involve circuitry without complementary pairs of semiconductor switches. In one example embodiment, the first pair of semiconductor switches 126, 128 and the second pair of semiconductor switches 130,132 may be n-channel junction gate field-effect transistor (JFET) switches and may comprise a respective high-temperature, wide bandgap material, such as SiC, AlN, GaN, AlGaN, GaAs, GaP, InP, AlGaAs, AlGaP, AlInGaP, and GaAsAlN.

As will be appreciated by one skilled in the art, p-channel SiC JFETs are presently believed to be impractical due to their relatively low-channel mobility, and consequently, known active load topologies for differential amplifiers have not been utilized in high-temperature applications since such topologies would involve p-channel SiC JFETs. Hybrid load circuitry embodying aspects of the present invention, advantageously eliminates a need of p-channel JFETs, and thus such a circuitry can reach the theoretical temperature limits of high-temperature, wide bandgap material JFETs (e.g., above 500° C.) and effectively provide a high-gain differential amplifier, which, in one example application, may be utilized to appropriately amplify in a high-temperature environment the relatively low-voltage (e.g., a few millivolts) electrical signals, which may be generated by sensors, such as thermocouples and strain gauges.

In one example embodiment, hybrid load circuitry 125 may further comprise a resistor-capacitor circuit 134 (e.g., a resistor 142 and a capacitor 140) arranged to provide a path (e.g., relatively high-impedance path) to an AC signal component with respect to the drain terminal of the switch of the differential pair of semiconductor switches, which receives the voltage indicative of the sensed parameter (e.g., switch 126). Circuit 134 is connected to a node 136 coupled in parallel circuit to the respective gate terminals of the second pair of semiconductor switches 130,132. It will be appreciated that node 136, which is connected to an electrical ground 135 by way of resistor 142 is effective to maintain an appropriate biasing for semiconductor switches 130, 132.

In one example embodiment, the value of resistor 142 may be chosen to be sufficiently low relative to the value of the input impedance at the respective gate terminals of switches 130, 132 so that, for example, an AC signal component at the drain terminal of differential switch 126, would be AC-coupled by way of capacitor 140 to the path provided by resistor 142, in lieu of the gate terminals of switches 130, 132. For example, presuming an input impedance in the order of 20 MΩ at the respective gate terminal of switch pair 130,132 relative to a resistance value in the order of 2 MΩ for resistor 142, it would be appreciated that resistor-capacitor circuit 124 would effect a high-impedance path to such AC signal component (e.g., at the drain of differential switch 126), and this effectively increases the AC gain of the differential amplifier.

For biasing purposes, hybrid load circuitry 125 may include a first resistor 144 coupled from a source terminal of one of the switches of the second pair of semiconductor switches (e.g., switch 130) to a drain terminal of one of the switches of the first pair of semiconductor switches (e.g., differential switch 126). Hybrid load circuitry 125 may further include a second resistor 146 coupled from a source terminal of the other one of the switches (e.g., switch 132) of the second pair of semiconductor switches to a drain terminal of the other one of the switches of the first pair of semiconductor switches (e.g, differential switch 128). A node 148 connected to the source terminal of switch 132 provides the amplified differential amplifier output. Preliminary experimental results have demonstrated feasibility of differential gains of at least approximately 47.8 dB, 51.4 dB and 57.8 dB at temperatures of 450° C., 300° C. and 25° C., respectively.

FIG. 4 is a schematic representation of hybrid load single-stage differential amplifier embodying aspects of the present invention, as may be integrated in a wireless telemetry system. Circuitry 120 may be arranged to amplify the AC output signal from a low-level output sensor (e.g., a strain gauge) and the amplified output signal from circuitry 120 may be signal-conditioned through a high-pass filter 160 and passed to a voltage-controlled oscillator 162, which may be configured to modulate a radio-frequency (RF) carrier. It will be appreciated that the relatively high-gain, which can be obtained with a differential amplifier embodying aspects of the present invention can advantageously avoid a need of multiple stages of amplification (AC amplifiers), thereby incrementally reducing costs as well as providing substantial signal integrity (e.g., improved signal-to-noise ratio) and increasing system reliability (e.g., less interconnections).

While various embodiments of the present invention have been shown and described herein, it will be apparent that such embodiments are provided by way of example only. Numerous variations, changes and substitutions may be made without departing from the invention herein. Accordingly, it is intended that the invention be limited only by the spirit and scope of the appended claims.

The invention claimed is:

1. A circuitry adapted to operate in a high-temperature environment of a turbine engine, the circuitry comprising:
    a sensing element disposed on a component of the turbine engine to sense a parameter of the component and provide a voltage indicative of the sensed parameter;
    a differential amplifier having an input terminal coupled to the sensing element to receive the voltage indicative of the sensed parameter; and
    a hybrid load circuitry AC-coupled to the differential amplifier, wherein the differential amplifier and the hybrid load circuitry are disposed in the high-temperature environment of the turbine engine.

2. The circuitry of claim 1, wherein the differential amplifier comprises a first pair of semiconductor switches, and the hybrid load circuitry comprises a second pair of semiconductor switches, each pair of switches having respective drain, source and gate terminals, wherein the hybrid load circuitry further comprises a resistor-capacitor circuit arranged to provide a path to an AC signal component with respect to the drain terminal of the switch of the first pair of semiconductor switches, which receives the voltage indicative of the sensed parameter.

3. The circuitry of claim 2, wherein the resistor-capacitor circuit is connected to a node coupled in parallel circuit to the respective gate terminals of the second pair of semiconductor switches.

4. The circuitry of claim 3, wherein a resistor of the resistor-capacitor circuit has a first lead connected to the node and a second lead electrically grounded.

5. The circuitry of claim 4, wherein a capacitor of the resistor-capacitor circuit has a first lead connected to the node and a second lead connected to the drain terminal of the switch of the first pair of semiconductor switches, which receives the voltage indicative of the sensed parameter.

6. The circuitry of claim 2, wherein the hybrid load circuitry further comprises a first resistor coupled from a source terminal of one of the switches of the second pair of semiconductor switches to a drain terminal of one of the switches of the first pair of semiconductor switches, 7. The circuitry of claim 6, wherein the hybrid load circuitry further comprises a second resistor coupled from a source terminal of the other one of the switches of the second pair of semiconductor switches to a drain terminal of the other one of the switches of the first pair of semiconductor switches.

8. The circuitry of claim 2, wherein the differential amplifier comprises a single stage differential amplifier.

9. The circuitry of claim 2, wherein the respective first and second pairs of semiconductor switches comprise circuitry without complementary pairs of semiconductor switches.

10. The circuitry of claim 2, wherein the respective first and second pairs of semiconductor switches comprise n-channel junction field-effect transistor (JFET) switches.

11. The circuitry of claim 2, wherein the respective first and second pairs of semiconductor switches comprise a respective high-temperature, wide bandgap material.

12. The circuitry of claim 11, wherein the high-temperature, wide bandgap material is selected from the group consisting of SiC, AlN, GaN, AlGaN, GaAs, GaP, InP, AlGaAs, AlGaP, AlInGaP, and GaAsAlN.

13. The circuitry of claim 1, wherein the sensing element comprises a strain gauge to sense a strain of the component, and the voltage is indicative of the sensed strain of the component.

14. A telemetry system comprising the circuitry of claim 1.

15. Circuitry comprising:
a differential amplifier; and
a hybrid load circuitry AC-coupled to the differential amplifier, wherein the differential amplifier and the hybrid load circuitry are disposed in the high-temperature environment of a turbine engine, wherein the differential amplifier comprises a first pair of semiconductor switches, and the hybrid load circuitry comprises a second pair of semiconductor switches, each pair of switches having respective drain, source and gate terminals, wherein the hybrid load circuitry further comprises a resistor-capacitor circuit arranged to provide a path to an AC signal component with respect to the drain terminal of the switch of the first pair of semiconductor switches, which receives the voltage indicative of the sensed parameter.

16. The circuitry of claim 15, wherein the resistor-capacitor circuit is connected to a node coupled in parallel circuit to the respective gate terminals of the second pair of semiconductor switches.

17. The circuitry of claim 16, wherein a resistor of the resistor-capacitor circuit has a first terminal connected to the node and a second terminal electrically grounded.

18. The circuitry of claim 17, wherein a capacitor of the resistor,-capacitor circuit has a first lead connected to the node and a second lead connected to a drain terminal of the switch of the first pair of semiconductor switches, which receives the voltage indicative of the sensed parameter.

19. The circuitry of claim 15, wherein the hybrid load circuitry further comprises a first resistor coupled from a source terminal of one of the switches of the second pair of semiconductor switches to a drain terminal of one of the switches of the first pair of semiconductor switches.

20. The circuitry of claim 19, wherein the active load circuitry further comprises a second resistor coupled from a source terminal of the other one of the switches of the second pair of semiconductor switches to a drain terminal of the other one of the switches of the first pair of semiconductor switches.

21. The circuitry of claim 15, wherein the differential amplifier comprises a single stage differential amplifier, wherein the respective first and second pairs of semiconductor switches comprise n-channel junction field-effect transistor (JFET) switches.

22. The circuitry of claim 15, wherein the respective first and second pairs of semiconductor switches comprise a respective high-temperature, wide bandgap material.

23. The circuitry of claim 22, wherein the high-temperature, wide bandgap material is selected from the group consisting of SiC, AlN, CaN, AlGaN, GaAs, GaP, InP, AlGaAs, AlGaP, AlInGaP, and GaAsAlN.

* * * * *

UNITED STATES PATENT AND TRADEMARK OFFICE
CERTIFICATE OF CORRECTION

PATENT NO. : 8,766,720 B2  
APPLICATION NO. : 13/537572  
DATED : July 1, 2014  
INVENTOR(S) : David J. Mitchell et al.

Page 1 of 1

It is certified that error appears in the above-identified patent and that said Letters Patent is hereby corrected as shown below:

On The Title Page, Item (73)  
Assignees should be: Siemens Energy, Inc., Orlando, FL (US)  
                             Arkansas Power Electronics International, Inc., Fayetteville, AR (US)

Signed and Sealed this  
Twenty-first Day of July, 2015

Michelle K. Lee  
*Director of the United States Patent and Trademark Office*